(12) United States Patent
Zhang (10) Patent No.: US 9,572,266 B2
(45) Date of Patent: Feb. 14, 2017

(54) REFLOW TREATING UNIT AND SUBSTRATE TREATING APPARATUS

(71) Applicant: Jian Zhang, Brookline, MA (US)

(72) Inventor: Jian Zhang, Brookline, MA (US)

(73) Assignee: Semigear, Inc., Wakefield, MA (US)

( * ) Notice: Subject to any disclaimer, the term of this patent is extended or adjusted under 35 U.S.C. 154(b) by 0 days.

(21) Appl. No.: 14/998,386

(22) Filed: Dec. 28, 2015

(65) Prior Publication Data

US 2016/0143155 A1     May 19, 2016

Related U.S. Application Data

(60) Division of application No. 13/987,512, filed on Aug. 1, 2013, now Pat. No. 9,226,407, which is a
(Continued)

(51) Int. Cl.
| | |
|---|---|
| *B23K 37/00* | (2006.01) |
| *H05K 3/34* | (2006.01) |
| *B23K 3/00* | (2006.01) |
| *B23K 37/04* | (2006.01) |
| *B23K 1/00* | (2006.01) |
| *B23K 1/008* | (2006.01) |

(Continued)

(52) U.S. Cl.
CPC ............. *H05K 3/3494* (2013.01); *B23K 1/008* (2013.01); *B23K 1/0016* (2013.01); *B23K 3/00* (2013.01); *B23K 3/04* (2013.01); *B23K 3/08* (2013.01); *B23K 37/04* (2013.01); *H01L 21/6719* (2013.01); *B23K 2201/40* (2013.01)

(58) Field of Classification Search
CPC .......... H05K 3/3494; H05K 3/34; B23K 3/04; B23K 3/08; B23K 1/0016; B23K 1/008; B23K 3/00; B23K 37/04–37/0452; B23K 2201/36–2201/42; H01L 21/6719
USPC ........................ 228/5.1, 49.5, 49.1, 47.1, 6.2
See application file for complete search history.

(56) References Cited

U.S. PATENT DOCUMENTS

| | | | | |
|---|---|---|---|---|
| 4,012,190 | A * | 3/1977 | Dicks ...................... | C03B 25/06 432/144 |
| 4,373,658 | A * | 2/1983 | March .................... | B23K 1/015 134/182 |

(Continued)

*Primary Examiner* — Kiley Stoner
(74) *Attorney, Agent, or Firm* — Don Halgren (57) ABSTRACT

Provided are a semiconductor substrate manufacturing apparatus and a substrate treating method, and more particularly, an apparatus and method for performing a reflow treating process on a semiconductor wafer. The apparatus treating apparatus includes a load port on which a carrier accommodating a substrate is seated, a substrate treating module including one reflow treating unit or a plurality of reflow treating units for performing a reflow process on the substrate, and a substrate transfer module including a transfer robot transferring the substrate between the load port and the substrate treating module, the substrate transfer module being disposed between the load port and the substrate treating module. The reflow treating unit includes a process chamber having a treating space therein and an exhaust member exhausting a fluid within the process chamber. The exhaust member includes a plurality of individual exhaust lines connecting a plurality of process chambers to each other and a common exhaust line connected to the plurality of individual exhaust lines to exhaust the fluid to the outside of the substrate treating module.

16 Claims, 6 Drawing Sheets

Related U.S. Application Data continuation-in-part of application No. 13/573,486, filed on Sep. 17, 2012, which is a continuation-in-part of application No. 12/930,462, filed on Jan. 7, 2011, now Pat. No. 8,274,161, which is a continuation-in-part of application No. 12/930,203, filed on Dec. 31, 2010, now Pat. No. 8,252,678, which is a continuation-in-part of application No. 12/653,454, filed on Dec. 14, 2009, now Pat. No. 7,982,320, which is a division of application No. 11/482,838, filed on Jul. 7, 2006, now Pat. No. 7,632,750, which is a continuation-in-part of application No. 10/832,782, filed on Apr. 27, 2004, now Pat. No. 7,008,879, which is a division of application No. 10/186,823, filed on Jul. 1, 2002, now Pat. No. 6,827,789.

(51) Int. Cl.
  *H01L 21/67* (2006.01)
  *B23K 3/04* (2006.01)
  *B23K 3/08* (2006.01)

(56) References Cited

U.S. PATENT DOCUMENTS

| | | | | |
|---|---|---|---|---|
| 4,602,417 A * | | 7/1986 | Mesch | H01L 21/67138 228/49.1 |
| 4,951,601 A * | | 8/1990 | Maydan | H01L 21/67167 118/715 |
| 5,071,057 A * | | 12/1991 | Murphy | B04C 5/08 228/183 |
| 5,193,735 A * | | 3/1993 | Knight | F27B 9/3077 219/388 |
| 5,302,209 A * | | 4/1994 | Maeda | C23C 16/4584 118/719 |
| 5,345,061 A * | | 9/1994 | Chanasyk | B23K 1/008 219/388 |
| 5,364,007 A * | | 11/1994 | Jacobs | B23K 3/0646 219/390 |
| 5,605,277 A * | | 2/1997 | Jackson | B23K 1/018 228/19 |
| 5,753,891 A * | | 5/1998 | Iwata | H01L 21/67109 219/390 |
| 5,855,465 A * | | 1/1999 | Boitnott | H01L 21/67745 204/298.25 |
| 5,922,230 A * | | 7/1999 | Yokota | B23K 1/008 198/465.3 |
| 5,993,500 A * | | 11/1999 | Bailey | B23K 1/008 228/42 |
| 6,096,999 A * | | 8/2000 | Schmits | B23K 3/04 219/389 |
| 6,234,788 B1 * | | 5/2001 | Lee | H01L 21/67098 118/719 |
| 6,319,553 B1 * | | 11/2001 | McInerney | C23C 16/4412 118/719 |
| 6,382,500 B1 * | | 5/2002 | Master | B23K 1/0016 228/180.1 |
| 6,572,010 B2 * | | 6/2003 | Dordi | B23K 3/0623 204/267 |
| 6,827,789 B2 * | | 12/2004 | Lee | H01L 21/6719 118/719 |
| 7,682,454 B2 * | | 3/2010 | Sneh | C23C 14/566 118/719 |
| 8,043,432 B2 * | | 10/2011 | Dip | C23C 16/45508 118/719 |
| 8,651,121 B2 * | | 2/2014 | Orii | H01L 21/02052 134/134 |
| 2002/0178705 A1 * | | 12/2002 | Mullins | B01D 46/02 55/385.2 |
| 2002/0185523 A1 * | | 12/2002 | Dordi | B23K 3/0623 228/215 |
| 2004/0000378 A1 * | | 1/2004 | Lee | H01L 21/6719 156/345.51 |
| 2007/0110548 A1 * | | 5/2007 | Oyama | H01L 21/67772 414/416.08 |
| 2007/0266556 A1 * | | 11/2007 | Kimura | H05K 13/0417 29/832 |
| 2009/0014126 A1 * | | 1/2009 | Ohtani | B08B 3/00 156/345.24 |
| 2009/0206145 A1 * | | 8/2009 | Tamori | B23K 1/008 228/15.1 |
| 2010/0012709 A1 * | | 1/2010 | Nikaido | B23K 1/0016 228/256 |
| 2010/0170939 A1 * | | 7/2010 | Ishikawa | H05K 3/341 228/220 |
| 2010/0260935 A1 * | | 10/2010 | Kato | C23C 16/402 427/255.28 |
| 2011/0315746 A1 * | | 12/2011 | Dautenhahn | B23K 1/0016 228/234.1 |
| 2012/0014689 A1 * | | 1/2012 | Ookouchi | H01L 21/67051 396/611 |
| 2012/0240424 A1 * | | 9/2012 | Sugihara | B23K 1/012 34/79 |
| 2013/0256389 A1 * | | 10/2013 | Ngai | B23K 1/008 228/176 |
| 2013/0263445 A1 * | | 10/2013 | Yokota | H05K 3/303 29/840 |
| 2014/0209662 A1 * | | 7/2014 | Ngai | H05K 13/0465 228/42 |
| 2015/0034699 A1 * | | 2/2015 | Zhang | H01L 21/67109 228/47.1 |
| 2015/0034702 A1 * | | 2/2015 | Zhang | H01L 24/75 228/176 |
| 2015/0329970 A1 * | | 11/2015 | Khan | C23C 16/56 118/719 |
| 2015/0334849 A1 * | | 11/2015 | Tsubota | B23K 1/0016 228/220 |
| 2016/0167148 A1 * | | 6/2016 | Oyama | B23K 1/015 228/234.2 |
| 2016/0256946 A1 * | | 9/2016 | Hiyama | B23K 1/008 |
| 2016/0329296 A1 * | | 11/2016 | Wasserman | H01L 24/75 |

* cited by examiner

REFLOW TREATING UNIT AND SUBSTRATE TREATING APPARATUS

BACKGROUND OF THE INVENTION

The present invention disclosed herein relates to a semiconductor substrate manufacturing apparatus and a substrate treating method, and more particularly, to an apparatus and method for performing a reflow treating process on a semiconductor wafer and this application being co-filed with sister application Semigear-30A, both of these applications each being a division of application Ser. No. 13/987,512, filed on Aug. 1, 2013, now U.S. Pat. No. 9,226,407, issued on 29 Dec. 2015 which was originally a co-filed application of Semigear-28 (application Ser. No. 13/987,511, Apparatus and Method for Treating a Substrate, Publication Number US-2015-0034702-A1), and Semigear-32 (application Ser. No. 13/987,510, Reflow Treating Unit and Substrate Treating Apparatus, Publication Number US-2015-0034699-A1) which were filed simultaneously herewith, which were each a CIP application of U.S. application Ser. No. 13/573,486, filed Sep. 17, 2012 (Semigear-24), which is a CIP of application Ser. No. 12/930,462, now U.S. Pat. No. 8,274,161, which is a CIP of application Ser. No. 12/930,203, now U.S. Pat. No. 8,252,678, which is a CIP of application Ser. No. 12/653,454, now U.S. Pat. No. 7,982,320, which is a DIV of application Ser. No. 11/482,838, now U.S. Pat. No. 7,632,750, which is a CIP of application Ser. No. 10/832,782, now U.S. Pat. No. 7,008,879, which is a DIV of application Ser. No. 10/186,823, now U.S. Pat. No. 6,827,789, each of the above being incorporated herein by reference in their entirety.

With the high integration of a semiconductor device, the number of connection pads for connecting a semiconductor chip on which a semiconductor integrated circuit is formed to an external circuit increases. Thus, the number of lead lines of a semiconductor package that is mounted on a printed circuit board (PCB) significantly increases.

As the number of the lead lines increases, packaging technologies to which a lead frame is applied according to a related art are difficult to be applied to a highly-integrated semiconductor chip including about 500 pins or more.

Thus, ball grid array (BGA) package technologies as new concepts in which output terminals of a semiconductor package are disposed by using a wide lower surface of the semiconductor package are being developed.

In the BGA package technologies, a semiconductor chip is mounted on a PCB, and a solder ball is disposed to correspond to an output terminal of the PCB. Also, an integrated circuit of a semiconductor package is electrically connected to an external circuit of an electrical device through the output terminal of the PCB and the solder ball connected to the output terminal.

Here, the solder ball is disposed on a surface opposite to the PCB on which the semiconductor integrated circuit is mounted. Also, a soldering process for electrically connecting the solder ball to the output terminal of the PCB is required.

Here, an apparatus for soldering the semiconductor chip to a surface of the PCB at a predetermined temperature to cure the soldered portion after the semiconductor chip is mounted on the surface of the PCB may be called a reflow apparatus.

In the reflow apparatus, the PCB on which the solder ball is placed is put in a heating furnace to heat the solder ball for a predetermined time at a predetermined temperature. As a result, the solder ball may be soldered to the output terminal of the PCB.

Generally, in a substrate treating apparatus for performing a reflow treating process, a portion of equipment constituting an exhaust device exhausting a fluid within a reflow treating unit may be frequently replaced due to fluxes and impurities which are generated during the reflow process.

SUMMARY OF THE INVENTION

The present invention provides a reflow treating unit in which an exhaust device exhausting a fluid generated during a reflow treating process is capable of efficiently exhausting the fluid and a substrate treating apparatus.

The feature of the present invention is not limited to the aforesaid, but other features not described herein will be clearly understood by those skilled in the art from descriptions below.

The present invention provides a substrate treating apparatus.

Embodiments of the present invention provide apparatus treating apparatuses including: a load port on which a carrier accommodating a substrate is seated; a substrate treating module including one reflow treating unit or a plurality of reflow treating units for performing a reflow process on the substrate; and a substrate transfer module including a transfer robot transferring the substrate between the load port and the substrate treating module, the substrate transfer module being disposed between the load port and the substrate treating module, wherein the reflow treating unit includes: a process chamber having a treating space therein; and an exhaust member exhausting a fluid within the process chamber, wherein the exhaust member includes: a plurality of individual exhaust lines connecting a plurality of process chambers to each other; and a common exhaust line connected to the plurality of individual exhaust lines to exhaust the fluid to the outside of the substrate treating module.

In some embodiments, the exhaust member may further include a trap removing impurities of the exhausted fluid.

In other embodiments, the trap may be provided in plurality, and the plurality of traps may be disposed on the plurality of individual exhaust lines, respectively.

In still other embodiments, the trap may be separable from each of the plurality of individual exhaust lines.

In even other embodiments, the plurality of process chambers may be arranged in a circular ring shape, the common exhaust line may be disposed at a center of the ring shape, and each of the individual exhaust lines may radially extend from the center of the ring shape when viewed from an upper side.

In yet other embodiments, the individual exhaust lines may be connected to upper portions of the process chambers, respectively.

In further embodiments, the process chamber may include: a lower housing; and an upper housing disposed to face the lower housing, wherein the reflow treating unit may further include: a rotation plate having one substrate hole or a plurality of substrate holes in which the substrate is fixed, the rotation plate being disposed between the upper housing and the lower housing; a driver rotating the rotation plate; and an elevation member elevating the lower housing to open or close the process chamber.

The present invention also provides a reflow treating unit.

Embodiments of the present invention provide reflow treating units including: a plurality of process chambers each having a treating space therein; and an exhaust member exhausting fluids within the plurality of process chambers, wherein the exhaust member includes: a plurality of individual exhaust lines connecting the plurality of process chambers to each other; and a common exhaust line connected to the plurality of individual exhaust lines to exhaust the fluid to the outside of the substrate treating module.

In other embodiments, the exhaust member may further include a trap removing impurities of the exhausted fluid.

In still other embodiments, the trap may be provided in plurality, and the plurality of traps may be disposed on the plurality of individual exhaust lines, respectively.

In even other embodiments, the trap may be separable from each of the plurality of individual exhaust lines.

In yet other embodiments, the plurality of process chambers may be arranged in a circular ring shape, the common exhaust line may be disposed at a center of the ring shape, and each of the individual exhaust lines may radially extend from the center of the ring shape when viewed from an upper side.

In further embodiments, each of the process chambers may include: a lower housing; and an upper housing disposed to face the lower housing, wherein the reflow treating unit may further include: a rotation plate having one substrate hole or a plurality of substrate holes in which the substrate is fixed, the rotation plate being disposed between the upper housing and the lower housing; a driver rotating the rotation plate; and an elevation member elevating the lower housing to open or close each of the process chambers.

The invention thus comprises an apparatus treating apparatus comprising: a load port on which a carrier accommodating a substrate is seated; a substrate treating module comprising one reflow treating unit or a plurality of reflow treating units for performing a reflow process on the substrate; and a substrate transfer module comprising a transfer robot transferring the substrate between the load port and the substrate treating module, the substrate transfer module being disposed between the load port and the substrate treating module, wherein the reflow treating unit preferably comprises: a process chamber having a treating space therein; and an exhaust member exhausting a fluid within the process chamber, wherein the exhaust member preferably comprises: a plurality of individual exhaust lines connecting a plurality of process chambers to each other; and a common exhaust line connected to the plurality of individual exhaust lines to exhaust the fluid to the outside of the substrate treating module. The exhaust member may further comprise a trap removing impurities of the exhausted fluid. The trap may be provided in plurality, and the plurality of traps are disposed on the plurality of individual exhaust lines, respectively. The trap is preferably separable from each of the plurality of individual exhaust lines. The plurality of process chambers are preferably arranged in a circular ring shape, the common exhaust line is disposed at a center of the ring shape, and each of the individual exhaust lines radially extends from the center of the ring shape when viewed from an upper side. The individual exhaust lines are connected to upper portions of the process chambers, respectively. The process chamber may comprise: a lower housing; and an upper housing disposed to face the lower housing, wherein the reflow treating unit further comprises: a rotation plate having one substrate hole or a plurality of substrate holes in which the substrate is fixed, the rotation plate being disposed between the upper housing and the lower housing; a driver rotating the rotation plate; and an elevation member elevating the lower housing to open or close the process chamber.

The invention may also comprise a reflow treating unit comprising: a plurality of process chambers each having a treating space therein; and an exhaust member exhausting fluids within the plurality of process chambers, wherein the exhaust member preferably comprises: a plurality of individual exhaust lines connecting the plurality of process chambers to each other; and a common exhaust line connected to the plurality of individual exhaust lines to exhaust the fluid to the outside of the substrate treating module. The exhaust member further comprises a trap removing impurities of the exhausted fluid. The trap is provided in plurality, and the plurality of traps are disposed on the plurality of individual exhaust lines, respectively. The trap is separable from each of the plurality of individual exhaust lines, and wherein the plurality of process chambers are arranged in a circular ring shape, the common exhaust line is disposed at a center of the ring shape, and each of the individual exhaust lines radially extends from the center of the ring shape when viewed from an upper side. Each of the process chambers may comprise: a lower housing; and an upper housing disposed to face the lower housing, wherein the reflow treating unit further comprises: a rotation plate having one substrate hole or a plurality of substrate holes in which the substrate is fixed, the rotation plate being disposed between the upper housing and the lower housing; a driver rotating the rotation plate; and an elevation member elevating the lower housing to open or close each of the process chambers.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Reference will now be made in detail to embodiments, examples of which are illustrated in the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art. In the drawings, the thicknesses of layers and regions are exaggerated for clarity.

Figure 1:
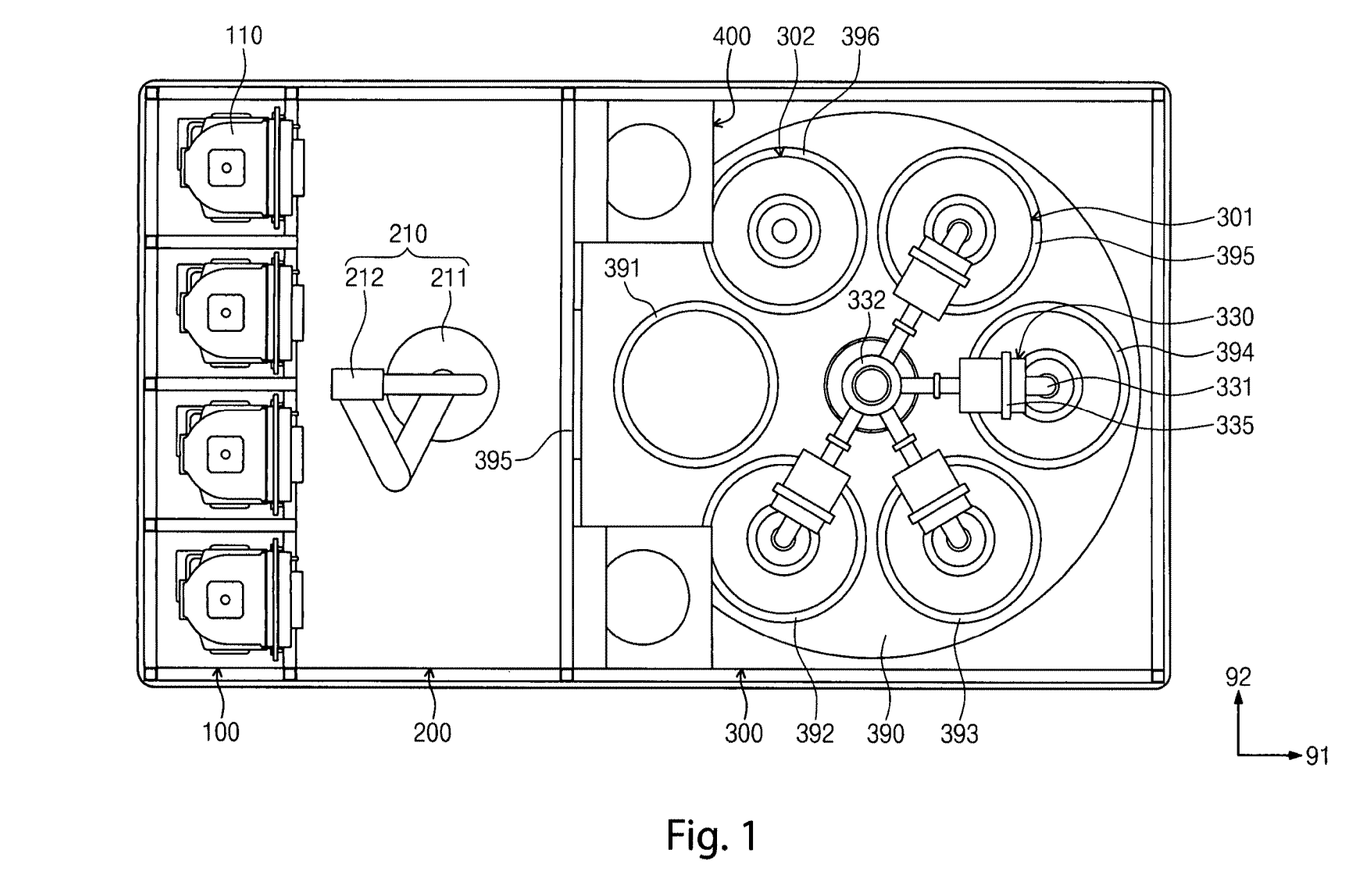
FIG. 1 is a plan view of a substrate treating apparatus according to an embodiment of the present invention.

FIG. 1 is a plan view of a substrate treating apparatus according to an embodiment of the present invention.

Referring to FIG. 1, a substrate treating apparatus 10 according to the present invention includes a load port 100, a substrate transfer module 200, and a substrate treating module 300. The load port 100, the substrate transfer module 200, and the substrate treating module 300 are sequentially disposed in a line. Hereinafter, a direction in which the load port 100, the substrate transfer module 200, and the substrate treating module 300 are arranged is referred to as a first direction 91. Also, when viewed from an upper side, a direction perpendicular to the first direction 91 is referred to as a second direction 92, and a direction perpendicular to a plane parallel to the first and second directions 91 and 92 is referred to as a third direction 93. The load port 100, the substrate transfer module 200, and the substrate treating module 300 are sequentially arranged in the first direction 91.

A carrier 110 in which a substrate is accommodated is seated on the load port 100. The load port 100 is provided in plurality. The plurality of load ports 100 are sequentially arranged in the second direction 92. The number of the load ports 100 may increase or decrease according to process efficiency and foot print conditions of the substrate treating module 30. A plurality of slots for accommodating substrates in a state where in which the substrates are disposed parallel to the ground are defined in the carrier 110. A front opening unified pod (FOUP) may be used as the carrier 110.

Figure 2:
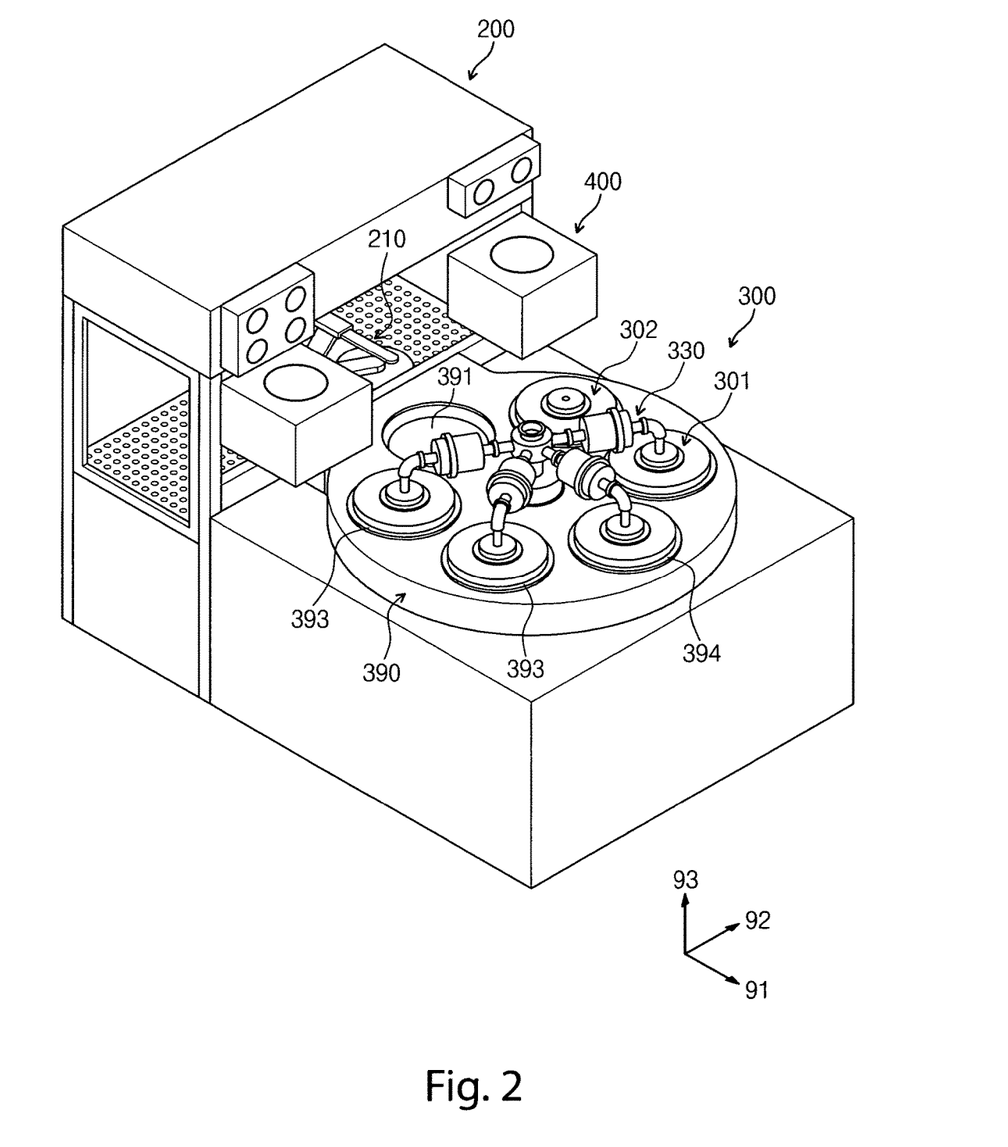
FIG. 2 is a perspective view of a substrate treating module and a substrate transfer module in the substrate treating apparatus of FIG. 1.

FIG. 2 is a perspective view of a substrate treating module and a substrate transfer module in the substrate treating apparatus of FIG. 1.

Referring to FIGS. 1 and 2, the substrate transfer module 200 is disposed between the load port 100 and a substrate treating module 300. A transfer robot 210 is disposed within the substrate transfer module 200.

The transfer robot 210 includes a body 211 and an arm part 212. The body 211 may be disposed at a central portion of the substrate transfer module 200. The arm part 212 includes a plurality of arms. The plurality of arms may be connected to each other to transfer a substrate from the load ports disposed on both ends in the second direction 92.

The transfer robot 210 transfers the substrate between the load port 100 and the substrate treating module 300. For example, the transfer robot 210 may transfer the substrate among the load port 100, the substrate treating module 300, and the cleaning unit 400.

The substrate treating module 300 includes reflow treating units 301 and 302, a support plate 390, a driver 382, and a rotation plate 381.

Figure 3:
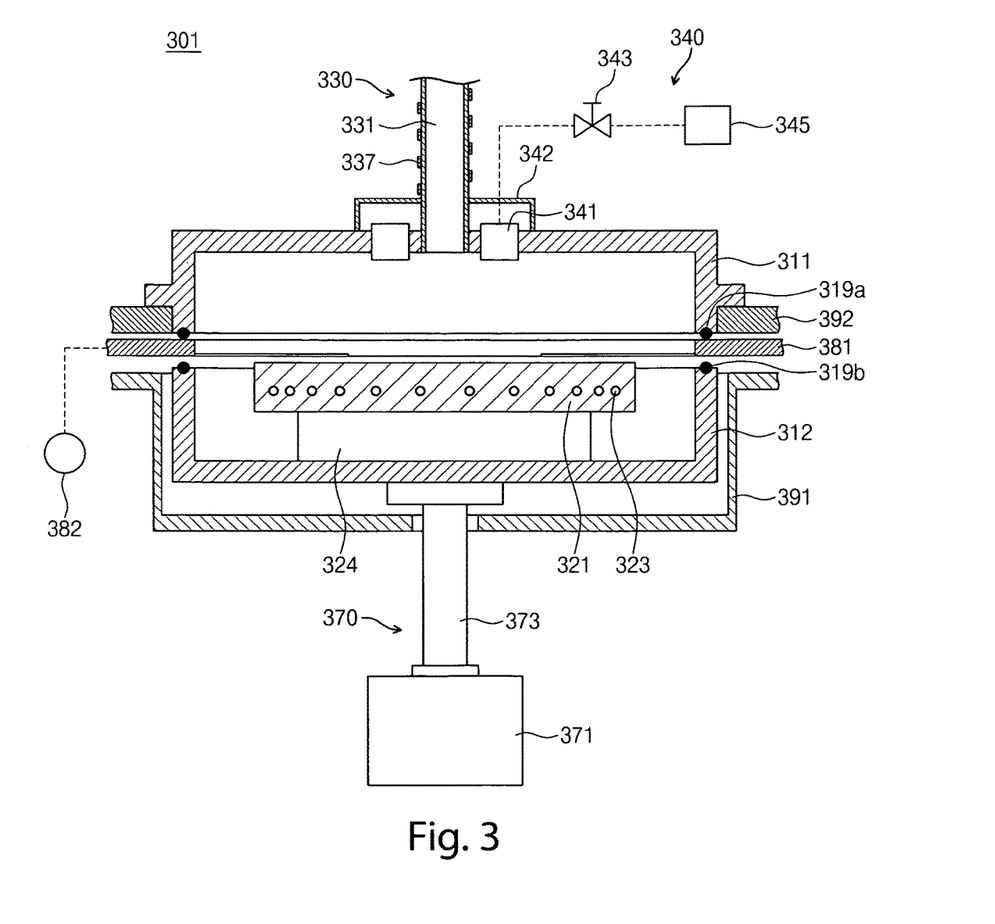
FIG. 3 is a cross-sectional view illustrating a reflow treating unit of FIG. 1 according to an embodiment.

FIG. 3 is a cross-sectional view illustrating the reflow treating unit of FIG. 1.

Referring to FIG. 3, the reflow treating units 301 and 302 includes a process chamber 310, a support member 320, a heater 323, an exhaust member 330, a process fluid supply member 340, and an elevation member 370. According to an embodiment, the reflow treating units 301 and 302 are provided in plurality. The plurality of reflow treating units 301 and 302 may be disposed in a circular ring shape.

The process chamber 310 includes an upper housing 311, a lower housing 312, and a sealing member 319a and 319b. The process chamber 310 has a treating space in which a reflow process is performed. The process chamber 310 may have a structure that is divided into the upper housing 311 and the lower housing 312, and then each of the upper and lower housings 311 and 312 is openable. The upper housing 311 has a cylindrical shape with a lower side opened.

The lower housing 312 is disposed to face the upper housing 311. The lower housing 312 has a cylindrical shape with an upper side opened. The upper housing 311 and the lower housing 312 may have the same sectional area.

The sealing member 319a and 319b may be disposed on an interface between the upper housing 311 and the lower housing 312. According to an embodiment, sealing members 319a and 319b may be disposed on a lower end of the upper housing 311 and an upper end of the lower housing 312, respectively. The sealing member 319a and 319b may be provided as an O-ring.

The support member 320 is disposed in the treating space within the process chamber 310. The support member 320 supports the substrate transferred into the treating space. The support member 320 includes a chuck 321 and a support shaft 324.

The chuck 321 is disposed on an upper end of the support member 320. According to an embodiment, the chuck 321 provides a vacuum pressure to an upper portion thereof. Thus, the chuck 321 may serve as a vacuum chuck that absorbs the substrate. On the other hand, a mechanical clamp or an electrostatic chuck may be used as the chuck 321. According to an embodiment, the heater 323 may be disposed within the chuck 321. The heater 323 heats the substrate. According to an embodiment, the heater 323 heats the chuck 321, and the heated chuck 321 heats the substrate.

The support shaft 324 supports the chuck 321. The support shaft 324 has a lower end contacting a bottom surface of the process chamber 310 and an upper end contacting a bottom surface of the chuck 321. Although not shown, the support member 320 may further include a driving part such as a motor that generates a rotation force. The driving part may transmit the rotation force into the chuck 321. The driving motor may include typical components such as a motor, a belt transmitting the rotation force transmitted from the driving part into a spindle, a power transmission part such as a chain, and the like.

Figure 4:
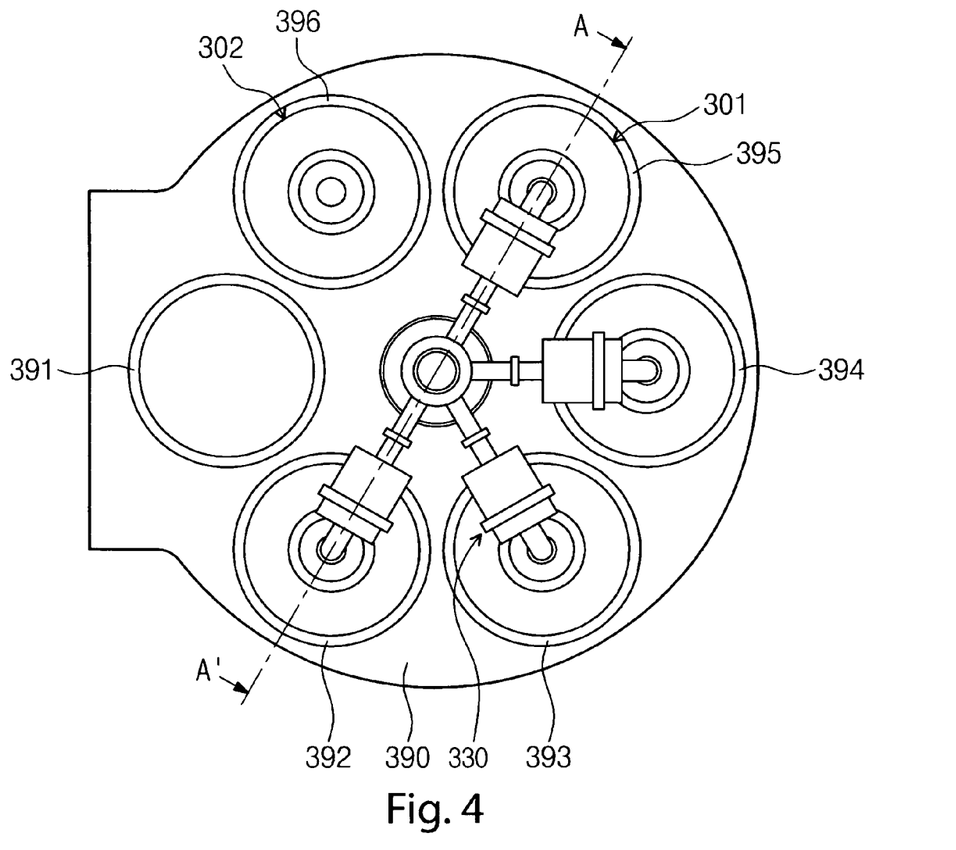
FIG. 4 is a plan view illustrating an exhaust member of FIG. 1.
Figure 5:
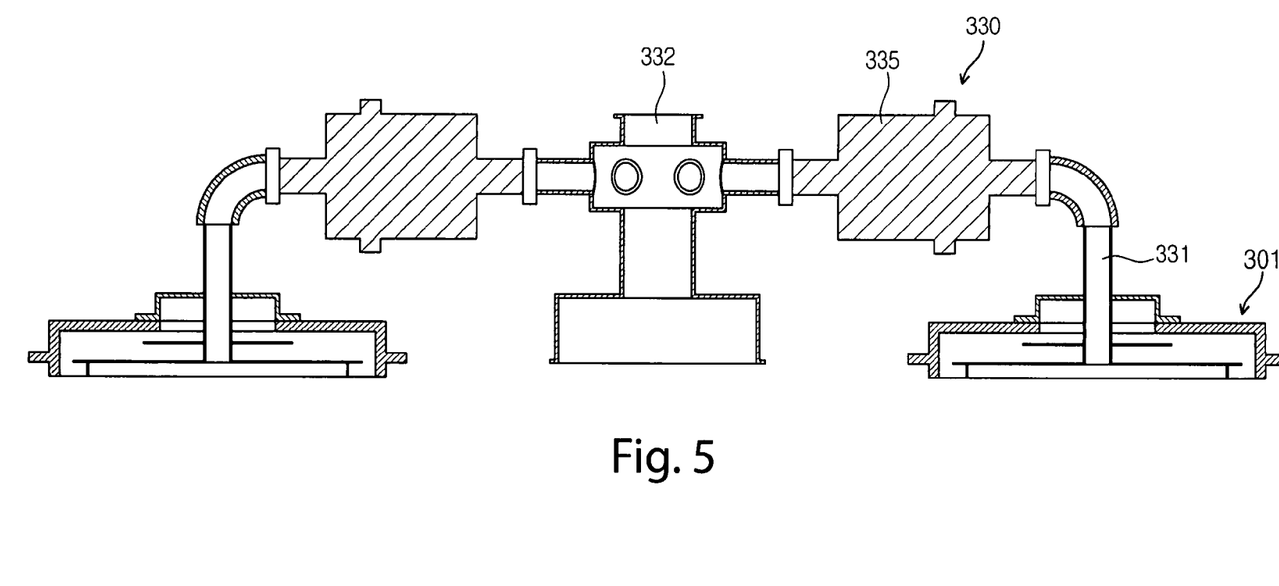
FIG. 5 is a cross-sectional view of the exhaust member taken along line A-A' of FIG. 4.

FIG. 4 is a plan view illustrating an exhaust member of FIG. 1, and FIG. 5 is a cross-sectional view of the exhaust member taken along line A-A' of FIG. 4.

Referring to FIGS. 4 and 5, the exhaust member 330 includes exhaust lines 331 and 332, an exhaust pressure providing member (not shown), and a trap 335.

The exhaust lines 331 and 332 include an individual exhaust line 331 and a common exhaust line 332. The individual exhaust line 331 connects the common exhaust line 332 to the process chamber 310. The individual exhaust line 331 has one end connected to a top surface of the process chamber 310. According to an embodiment, the individual exhaust line 331 may have one end connected to a central portion of a top surface of the process chamber 310. The individual exhaust line 331 has the other end connected to the common exhaust line 332. The individual exhaust line 331 may have the same number as that of process chamber 310. According to an embodiment, four individual exhaust lines 331 may be provided. On the other hand, four or more individual exhaust lines 331 or four or less individual exhaust lines 331 may be provided. According to an embodiment, when viewed from an upper side, the individual exhaust line 331 may radially extend toward a center of the common exhaust line 332.

The common exhaust line 332 may be disposed at a central portion of the plurality of process chambers 310. The common exhaust line 332 may extend in the third direction 93. According to an embodiment, the common exhaust line 332 has a lower end connected to the plurality of individual exhaust lines 331. The common exhaust line 332 has an upper end connected to an exhaust pressure providing member (not shown). The exhaust pressure providing member (not shown) provides a vacuum pressure into the exhaust lines 331 and 332. The vacuum pressure generated in the exhaust pressure providing member (not shown) may be provided into the process chamber 310 via the common exhaust line 332 and the individual exhaust line 331.

According to an embodiment, the trap 335 may be disposed on the individual exhaust line 331. Thus, the trap 335 may have the same number as that of individual exhaust lines 331, respectively. The trap 335 may remove impurities from an exhaust fluid flowing into the exhaust lines 331 and 332. According to an embodiment, the trap 335 may be separable. On the other hand, the trap 335 may be disposed on the common exhaust line 332. In this case, only one trap 335 may be provided.

Referring again FIGS. 2 and 3, the process fluid supply member 340 includes a supply nozzle 341, a supply line 342, a valve 343, and a process fluid storage part 345. The supply nozzle 341 is disposed on the top surface of the process chamber 310. According to an embodiment, the supply nozzle 341 may be disposed to surround the individual exhaust line 331. On the other hand, a plurality of supply nozzles 341 may surround the individual exhaust lines 331 at a predetermined distance.

The supply line 342 connects the supply nozzle 341 to the process fluid storage part 345. A process fluid moves from the process fluid storage part 345 into the treating process within the process chamber 310 through the supply line 342. The valve 343 is disposed in the supply line 342. The valve 343 controls a flow rate of the process fluid flowing into the supply line 342.

The elevation member 370 includes an elevation driving part 371 and a support 373. According to an embodiment, the elevation member 370 may elevate the lower housing 312 to open or close the process chamber 310. The elevation driving part 371 is disposed below a support plate 391. The elevation driving part 371 generates power for elevating the lower housing 312. The support 373 connects the elevation driving part 371 to the lower housing 312. The support 373 may be extensible in length. The support 373 may be elongated or contracted by the power provided from the elevation driving part 371 to elevate the lower housing 312.

The rotation plate 381 is disposed between an upper support plate 392 and a lower support plate 391. Also, the rotation plate 381 is disposed between the upper housing 311 and the lower housing 312. According to an embodiment, in the process chamber 310, the upper housing 311 is in contact with a top surface of the rotation plate 381, and the lower housing 312 is in contact with a bottom surface of the rotation plate 381. As a result, the process chamber 310 is closed. The rotation plate 381 is provided in a flat plate shape having one hole or a plurality of substrate holes. The substrate hole may have a diameter greater than a sectional area of the substrate. A support pin 385 is disposed on a bottom surface of the substrate hole. The support pin 385 supports a bottom surface of the substrate so that the substrate transferred into the support plate 390 is disposed in the substrate hole. The substrate hole may be provided with the same number as that of grooves 399a to 399f of the support plate. According to an embodiment, six substrate holes and six grooves 399a to 399f of the support plate may be provided. The rotation plate 381 rotates together with the substrate to transfer the substrate into the plurality of process chambers 310. Specifically, the substrate holes may include first to sixth substrate holes. Also, the process chamber 310 may include first to fifth process chambers. Also, the substrate treating module may be disposed on a position at which the first to fifth substrate holes respectively correspond to first to fifth process chambers. Thereafter, when the rotation plate rotates, and thus the sixth substrate hole moves at a position corresponding to the first process chamber, the second to fifth substrate holes may move at positions corresponding to the second to fifth process chambers, respectively. The reflow process may be performed through the above-described processes while passing through the first to fifth process chambers. The driver 382 is connected to the rotation plate 381 to rotate the rotation plate 381.

The support plate 390 has a flat plate shape with a predetermined thickness. The support plate 390 may have a circular plate shape. The support plate 390 has one groove or a plurality of grooves 399a to 399f in a top surface thereof. According to an embodiment, the support plate 390 has six grooves 399a to 399f. Here, the grooves 399a to 399f may be disposed with a predetermined distance. Also, the grooves 399a to 399f may be arranged in a circular ring shape on a top surface of the support plate 390. The process chamber 310 may be provided in a portion or the whole of the plurality of grooves 399a to 399f. According to an embodiment, the process chamber 310 may be provided in the five grooves 399b to 399f of the six grooves 399a to 399f. An entrance groove 399a in which the process chamber 310 is not provided may be used as a passage through which the substrate is transferred into the substrate treating module 300. The entrance groove 399a may be defined closer to the substrate transfer module 300 than other grooves 399b to 399f. An opening 395 is defined in one side surface of the support plate 390. The opening 395 may serve as a passage through which the substrate transfer module 200 is connected to the substrate treating module 300. The substrate is transferred through the opening 395, and the opening 395 communicates with the entrance groove 399a.

The support plate 390 includes an upper support plate 392 and a lower support plate 391. The upper support plate 392 and the lower support plate 391 have the same sectional area.

Figure 6:
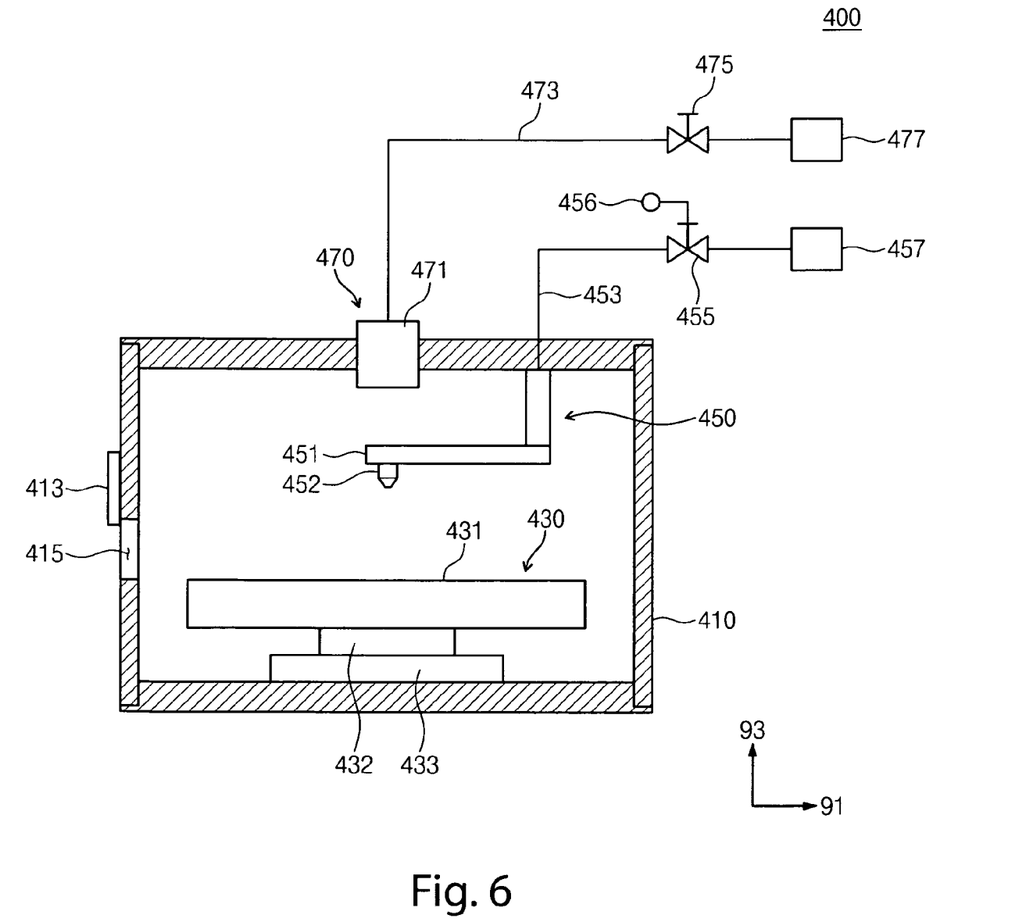
FIG. 6 is a cross-sectional view illustrating a cleaning unit of FIG. 1.

FIG. 6 is a cross-sectional view illustrating a cleaning unit of FIG. 1.

Referring to FIG. 6, the cleaning unit 400 includes a cleaning chamber 410, a substrate support member 430, and fluid supply members 450 and 470. The cleaning unit 400 is disposed within the substrate treating module 300. The cleaning unit 400 may be provided in plurality. According to an embodiment, the cleaning unit 400 may be disposed on a position at which the cleaning unit 400 is in contact with the substrate transfer module 200. Also, the cleaning unit 400 may be disposed above the reflow treating unit 301. Thus, an inner space of the substrate treating module 300 may be efficiently utilized.

The cleaning chamber 410 provides a space in which the substrate is cleaned. A substrate transfer part 415 through which the substrate is taken in or out is disposed in one side surface of the cleaning chamber 410. A door 413 for opening or closing the substrate transfer part 415 is disposed on an outer surface of the substrate transfer part 415. According to an embodiment, the substrate transfer part 415 may be disposed in a surface of the cleaning chamber 410 facing the substrate transfer module 200.

The substrate support member 430 includes a vacuum chuck 431, a support shaft 432, and a driving part 433. The substrate support member 430 is disposed within the cleaning chamber 410.

The vacuum chuck 431 is disposed on an upper end of the substrate support member 430. The vacuum chuck 431 supports the substrate transferred into the cleaning chamber 410. The vacuum chuck 431 provides a vacuum pressure to an upper portion thereof. The vacuum chuck 431 fixes the substrate by using the vacuum pressure. On the other hand, the substrate may be fixed by using a mechanical clamp or an electrostatic chuck.

The support shaft 432 connects to the driving part 433 to the vacuum chuck 431. The support shaft 432 has one end connected to a lower end of the vacuum chuck 431 and the other end connected to an upper end of the driving part 433. The support shaft 432 may transmit rotation force into the vacuum chuck 431 when the driving part 433 rotates.

The driving part 433 is in contact with the bottom surface of the process chamber 310. The driving part 433 may include a motor to generate rotation power. On the other hand, the driving part 433 may not rotate.

The fluid supply members 450 and 470 include a first fluid supply member 450 and a second fluid supply member 470. According to an embodiment, the first fluid supply member 450 may supply deionized water (DIW). Also, the second fluid supply member 470 may supply nitrogen gas ($N_2$).

The first fluid supply member 450 includes a nozzle arm 451, a nozzle 452, a first fluid supply line 453, a first fluid storage part 457, a first fluid control valve 455, and a pressure control part 456.

The nozzle arm 451 is disposed within the cleaning chamber 410. The nozzle arm 451 includes a first nozzle arm and a second nozzle arm. The first nozzle arm has an upper end that is in contact with a top surface of the cleaning chamber 410. Also, the first nozzle arm has the other end vertically extending downward from the upper end thereof. The other end of the first nozzle arm is connected to the second nozzle arm. The second nozzle arm extends vertically from a lower end of the first nozzle arm and horizontally with respect to a top surface of the cleaning chamber 410. The second nozzle arm has one end connected to the first nozzle arm and the other end on which the nozzle 452 is disposed on a bottom surface thereof. According to an embodiment, the nozzle arm 451 may be rotatably provided by using the first nozzle arm as a shaft. Thus, a first fluid may be uniformly supplied onto an entire surface of the substrate. According to an embodiment, DIW may be used as the first fluid.

The nozzle 452 is disposed on a bottom surface of an end of the second nozzle arm. The nozzle 452 sprays the first fluid onto the substrate.

The first fluid supply line 453 connects the first fluid storage part 457 to the nozzle arm 451. The first fluid storage part 457 stores the first fluid. The first fluid stored in the first fluid storage part 457 moves into the nozzle 452 through the first fluid supply line 453. The first fluid control valve 455 is disposed in the first fluid supply line 453. The first fluid control valve 455 may control a flow rate of the first fluid flowing into the first fluid supply line 453. The pressure control part 456 is connected to the first fluid control valve 455. The pressure control part 456 controls the first fluid control valve 455 to control a pressure of the sprayed first fluid.

The second fluid supply member 470 includes a second fluid spray nozzle 471, a second fluid supply line 473, a second fluid storage part 477, a second fluid control valve 475, and a pressure control part.

The second fluid spray nozzle 471 is disposed on the top surface of the cleaning chamber 410. According to an embodiment, the second fluid spray nozzle 471 may be disposed at a central portion of the top surface of the cleaning chamber 410. The second fluid spray nozzle 471 sprays a second fluid onto the substrate.

The second fluid supply line 473 connects the second fluid storage part 477 to the second fluid spray nozzle 471. The second fluid storage part 477 stores the second fluid. The second fluid stored in the second fluid storage part 477 moves into the second fluid spray nozzle 471 through the second fluid supply line 473. A second fluid control valve 475 is disposed in the second fluid supply line 473. The second fluid control valve 475 may control a flow rate of the second fluid flowing into the second fluid supply line 473. The pressure control part is connected to the second fluid control valve 475. The pressure control part controls the second fluid control valve 475 to control a pressure of the sprayed second fluid.

Although not shown, the cleaning unit 400 may further include an exhaust member (not shown). The exhaust member (not shown) may exhaust the fluid that is already used for cleaning within the cleaning unit 400 to the outside.

Alternatively, the above-described cleaning unit 400 may not be provided.

Hereinafter, a substrate treating method including a reflow treating method using the substrate treating apparatus according to an embodiment of the present invention will be described.

The substrate treating method according to an embodiment of the present invention includes a loading process in which a substrate to which a solder bump is attached is loaded from a load port into a substrate transfer module, a cleaning process in which the substrate and the solder bump are cleaned within a cleaning unit, a reflow process which is performed on the substrate in a substrate treating module, and an unloading process in which the substrate is transferred into the load port.

The cleaning process may include a primary cleaning process in which the substrate and the solder bump are cleaned before the reflow process and a secondary cleaning process in which the substrate and the solder bump are cleaned after the reflow process. Also, the cleaning process includes a first cleaning process in which a first fluid for cleaning the substrate is supplied onto the substrate and a second cleaning process in which a second fluid for drying the substrate is supplied onto the substrate.

In general, the substrate cleaning process in the substrate treating process for performing the reflow process may be performed by using a separate apparatus. However, according to an embodiment of the present invention, the cleaning process and the reflow treating process may be performed within one substrate treating apparatus. Thus, a time required for performing the substrate treating process including the reflow treating process may be reduced to improve process efficiency. Also, it may prevent efficiency of the substrate treating process from being reduced by impurities and fluxes.

The reflow process may be performed while the substrate on which the primary cleaning process is performed is successively transferred from a first process chamber to a fifth process chamber. Here, in the first to fourth process chambers, the substrate and the solder bump may be heated. Also, in the fifth process chamber, the substrate and the solder bump may be heated or cooled. The heating process and the reflow process may be performed on the substrate and the solder bump within each of the process chambers while the substrate moves from the first process chamber to the fourth process chamber. Thereafter, the substrate is cooled within the fifth process chamber. The substrate passing through the first to fifth process chambers to completely perform the reflow process is transferred to the outside of the reflow treating unit.

The secondary cleaning process is performed on the substrate on which the reflow treating process is performed.

In the secondary cleaning process, the fluxes and impurities that are mainly generated in the reflow process are removed. The substrate on which the secondary cleaning process is performed is transferred into the substrate transfer module.

The feature of the present invention is not limited to the aforesaid, but other features not described herein will be clearly understood by those skilled in the art from this specification and the accompanying drawings.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An apparatus treating apparatus comprising:
   a load port on which a carrier accommodating a substrate is seated;
   a substrate treating module comprising one reflow treating unit or a plurality of reflow treating units for performing a reflow process on the substrate; and
   a substrate transfer module comprising a transfer robot transferring the substrate between the load port and the substrate treating module, the substrate transfer module being disposed between the load port and the substrate treating module,
   wherein the reflow treating unit comprises:
   a process chamber having a treating space therein; and
   an exhaust member exhausting a fluid within the process chamber,
   wherein the exhaust member comprises:
   a plurality of individual exhaust lines connecting a plurality of process chambers to each other; and
   a common exhaust line connected to the plurality of individual exhaust lines to exhaust the fluid to the outside of the substrate treating module, wherein the exhaust member further comprises a trap removing impurities of the exhausted fluid, wherein the trap is provided in plurality, and the plurality of traps are disposed on the plurality of individual exhaust lines, respectively, wherein the trap is separable from each of the plurality of individual exhaust lines; and wherein the plurality of process chambers are arranged in a circular ring shape, the common exhaust line is disposed at a center of the ring shape, and wherein each of the individual exhaust lines radially extends from the center of the ring shape when viewed from an upper side; and
   wherein the reflow treating unit also comprises:
   a plurality of process chambers each having a treating space therein, the exhaust chambers being arranged in a ring shape;
   a support member disposed within the treating space;
   an exhaust member connected to a top surface of each process chamber to exhaust a fluid from within the treating space, wherein the exhaust member further comprises an exhaust line in communication with each process chamber, each exhaust line includes a top accessible, separable, impurity removing trap for removing impurities of the exhausted fluid wherein each trap is separable from its exhaust line and wherein the plurality of process chambers are arranged in a circular ring, with a common exhaust line disposed at the center of the ring above the process chambers, and wherein each of the individual exhaust lines extend radially from the center of the ring arrangement to each process chamber; and
   an absorption prevention plate spaced apart from an upper portion of the support member, the absorption prevention plate having a flat plate shape with a predetermined thickness; and wherein the reflow treating unit further comprises a heating member enabling the heating the absorption prevention plate.

2. The apparatus treating apparatus of claim 1, wherein the exhaust member is connected to the top surface of the process chamber and comprises the exhaust line through which an exhausted fluid flows, wherein the exhaust line passes through the process chamber and is directly connected to the absorption prevention plate, and wherein the heating member comprises a heater having a tape shape surrounding the exhaust line several times, wherein the heater heats the exhaust line, and the absorption prevention plate is heated by the heated exhaust line.

3. The apparatus treating apparatus of claim 2, wherein the absorption prevention plate is disposed to overlap with the support member when viewed from an upper side, and wherein the absorption prevention plate comprises:
   a horizontal part having a flat plate shape with a predetermined thickness;
   and a vertical part surrounding an edge region of a bottom surface of the horizontal part, the vertical part vertically extending downward.

4. A reflow treating unit comprising:
   a plurality of process chambers each having a treating space therein; and
   an exhaust member exhausting fluids within the plurality of process chambers,
   wherein the exhaust member comprises:
   a plurality of individual exhaust lines connecting the plurality of process chambers to each other; and
   a common exhaust line connected to the plurality of individual exhaust lines to exhaust the fluid to the outside of the substrate treating module, wherein the exhaust member further comprises a trap removing impurities of the exhausted fluid, wherein the trap is provided in plurality, and
   the plurality of traps are disposed on the plurality of individual exhaust lines, respectively; wherein each trap is separable from each of the plurality of individual exhaust lines, and wherein the plurality of process chambers are arranged in a circular ring shape, the common exhaust line being disposed at a center of the ring shape, and each of the individual exhaust lines radially extends from the center of the ring shape when viewed from an upper side; and
   the circular array of process chambers wherein each chamber having a treating space therein; including:
   a support member disposed within the treating space;
   the exhaust member being connected to a top surface of each process chamber to exhaust a fluid from within the treating space within each process chamber, and wherein the exhaust member further comprises an exhaust line in communication with each process chamber, each of the exhaust line consisting of a top accessible, separable, impurity removing trap for removing impurities of the exhausted fluid wherein each trap is separable from its exhaust line and wherein the plurality of process chambers share the common exhaust line disposed at the center of the annular array of process chambers; and an absorption prevention plate spaced apart from an upper portion of the support member, the absorption prevention plate having a flat plate shape with a predetermined thickness, wherein the reflow treating unit further comprises a heating member heating the absorption prevention plate.

5. The reflow treating unit of claim 4, wherein the exhaust member is connected to the top surface of the process chamber comprises the exhaust line through which an exhausted fluid flows, wherein the exhaust line passes through the process chamber and is directly connected to the absorption prevention plate.

6. The reflow treating unit of claim 5, wherein the heating member comprises a heater having a tape shape surrounding the exhaust line several times, wherein the heater heats the exhaust line, and the absorption prevention plate is heated by the heated exhaust line.

7. The reflow treating unit of claim 6, wherein the absorption prevention plate comprises:
a horizontal part having a flat plate shape with a predetermined thickness; and
a vertical part surrounding an edge region of a bottom surface of the horizontal part, the vertical part extending vertically downward, wherein the absorption plate is arranged to overlap the support member when viewed from an upper side.

8. A reflow treating unit comprising:
a plurality of process chambers each having a treating space therein; and
an exhaust member exhausting fluids within the plurality of process chambers,
wherein the exhaust member comprises:
a plurality of individual exhaust lines connecting the plurality of process chambers to each other; and
a common exhaust line connected to the plurality of individual exhaust lines to exhaust the fluid to the outside of the substrate treating module, wherein the exhaust member further comprises a trap removing impurities of the exhausted fluid, wherein the trap is provided in plurality, and
the plurality of traps are disposed on the plurality of individual exhaust lines, respectively; wherein each trap is separable from each of the plurality of individual exhaust lines, and wherein the plurality of process chambers are arranged in a circular ring shape, the common exhaust line being disposed at a center of the ring shape, and each of the individual exhaust lines radially extends from the center of the ring shape when viewed from an upper side; and
wherein each process chamber has a treating space therein, with a support member disposed within the treating space; the exhaust member being connected to a top surface of each process chamber to exhaust a fluid from within the treating space within each process chamber, and wherein the exhaust member further comprises the exhaust line being in communication with each process chamber wherein each exhaust line consists of a top accessible, separable, impurity removing trap for removing impurities of the exhausted fluid; and
an absorption prevention plate spaced apart from an upper portion of the support member, the absorption prevention plate having a flat plate shape with a predetermined thickness.

9. The reflow treating unit of claim 8, wherein the reflow treating unit further comprises a heating member heating the absorption prevention plate.

10. The reflow unit of claim 8, wherein the process chambers also comprises:
a lower housing; and an upper housing disposed to face the lower housing,
and wherein the reflow treating unit further comprises a rotation plate having one substrate hole or a plurality of substrate holes in which the substrate is fixed, the rotation plate being disposed between the upper housing and the lower housing; a driver rotating the rotation plate; and an elevation member elevating the lower housing to open or close the process chamber.

11. The reflow treating unit of claim 8, wherein the upper housing is arranged to face the lower housing, having a rotation plate having one a plurality of substrate holes in which each substrate is fixed, the rotation plate being disposed between the upper housing and the lower housing.

12. The reflow treating unit of claim 10, wherein the reflow treating unit further comprises a heating member heating the absorption prevention plate.

13. The reflow treating unit of claim 11, wherein the exhaust member is connected to a top surface of the process chamber and comprises the exhaust line through which an exhausted fluid flows, wherein the exhaust line passes through the process chamber and is directly connected to the absorption prevention plate.

14. The reflow treating unit of claim 13, wherein the heating member comprises a heater having a tape shape surrounding the exhaust line several times, wherein the heater heats the exhaust line, and the absorption prevention plate is heated by the heated exhaust line.

15. The reflow treating unit of claim 14, wherein the absorption prevention plate comprises:
a horizontal part having a flat plate shape with a predetermined thickness; and
a vertical part surrounding an edge region of a bottom surface of the horizontal part, the vertical part vertically extending downward,
wherein the absorption prevention plate is disposed to overlap with the support member when viewed from an upper side.

16. The reflow treating unit of claim 15, wherein the reflow treating unit further comprises a heating member heating the absorption prevention plate.

* * * * *